United States Patent
Kao et al.

(10) Patent No.: US 11,182,524 B1
(45) Date of Patent: Nov. 23, 2021

(54) FIXING DEVICE FOR CLOCK TREE AND FIXING METHOD THEREOF

(71) Applicants: Global Unichip Corporation, Hsinchu (TW); Taiwan Semiconductor Manufacturing Company, Ltd., Hsinchu (TW)

(72) Inventors: Chen-Yuan Kao, Hsinchu (TW); Hsin-Lung Li, Hsinchu (TW); Min-Hsiu Tsai, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/144,165

(22) Filed: Jan. 8, 2021

(30) Foreign Application Priority Data

Nov. 30, 2020 (TW) ................................ 109141946

(51) Int. Cl.
*G06F 30/327* (2020.01)
*G06F 30/396* (2020.01)

(52) U.S. Cl.
CPC .......... *G06F 30/327* (2020.01); *G06F 30/396* (2020.01)

(58) Field of Classification Search
USPC ........................................................ 716/103
See application file for complete search history.

(56) References Cited

U.S. PATENT DOCUMENTS

| 2008/0301594 A1* | 12/2008 | Jiang | G06F 30/396 716/134 |
| 2015/0078495 A1* | 3/2015 | Hossain | H04L 27/0014 375/346 |
| 2017/0278415 A1* | 9/2017 | Algaraui | G06F 16/24578 |

* cited by examiner

*Primary Examiner* — Mohammed Alam
(74) *Attorney, Agent, or Firm* — JCIPRNET

(57) ABSTRACT

A fixing device and a fixing method for a clock tree are provided. The fixing method for the clock tree includes: performing a clock signal path tracking operation on a netlist of a circuit according to timing constraint information to obtain a clock tree circuitry structure; identifying a convergency status of the clock tree circuitry structure to find out at least one clock convergence point, and setting one of a plurality of clock signals on the clock convergence point as a selected clock signal; performing a fix point identification operation on the clock tree circuitry structure based on the selected clock signal to obtain a plurality of candidate fix points; and calculating a plurality weighting values of the candidate fix points, obtaining a plurality of selected fixed points according to the weighting values.

10 Claims, 8 Drawing Sheets

| Candidate fix point | Weighting value | Candidate fix point | Weighting value | Candidate fix point | Weighting value |
|---|---|---|---|---|---|
| A=1 | 0.5 | F=0 | 0.5 | J2=0 | 0.5 |
| B=1 | 0.5 | G=1 | 0.5 | J3=1 | 1 |
| C=1 | 1 | H=1 | 0.5 | K=0 | 0.5 |
| D=1 | 1 | I=1 | 1 | L=1 | 1 |
| C=0 | 0.5 | J=1 | 2 | M=1 | 1 |
| D=0 | 0.5 | J=0 | 0.5 | N=0 | 1 |
| E=0 | 0.5 | J1=1 | 1 | O=1 | 1 |

| Candidate fix point | Weighting value | Candidate fix point | Weighting value | Candidate fix point | Weighting value |
|---|---|---|---|---|---|
| A=1 | 0.5 | F=0 | 0.5 | J2=0 | 0.5 |
| B=1 | 0.5 | G=1 | 0.5 | J3=1 | 1 |
| C=1 | 1 | H=1 | 0.5 | K=0 | 0.5 |
| D=1 | 1 | I=1 | 1 | L=1 | 1 |
| C=0 | 0.5 | J=1 | 2 | M=1 | 1 |
| D=0 | 0.5 | J=0 | 0.5 | N=0 | 1 |
| E=0 | 0.5 | J1=1 | 1 | O=1 | 1 |

FIXING DEVICE FOR CLOCK TREE AND FIXING METHOD THEREOF

CROSS-REFERENCE TO RELATED APPLICATION

This application claims the priority benefit of Taiwanese application serial no. 109141946, filed on Nov. 30, 2020. The entirety of the above-mentioned patent application is hereby incorporated by reference herein and made a part of this specification.

BACKGROUND

Technical Field

The disclosure relates to a fixing device for a clock tree and a fixing method thereof, and in particularly, relates to a fixing device capable of automatically executing a fixing method for a clock tree.

Description of Related Art

In the field of circuit design, a clock prefix operation is required to be performed on a clock tree when a functional clock signal is treated as a scan clock signal to perform a clock scanning operation. Regarding a circuit with a complex clock structure, a design has to spend a lot of time working on such a prefix operation, and reduced design efficiency is thus provided.

In existing electronic design automation (EDA) software, a plurality of multiplexers are inserted into a circuit most of the time. In this way, a clock signal may be transmitted to the inside of the circuit through these inserted multiplexers. Such an approach often causes a burden in performing clock tree synthesis (CTS), and an area of the circuit may be considerably increased as a result.

SUMMARY

The disclosure is directed to a fixing device for a clock tree and a fixing method thereof capable of automatically and quickly performing a prefix operation on the clock tree.

The disclosure provides a fixing method for a clock tree including following steps. A clock signal path tracking operation is performed on a netlist of a circuit according to timing constraint information to obtain a clock tree circuitry structure. A convergency status of the clock tree circuitry structure is identified to find out at least one clock convergence point, and one of a plurality of clock signals on the clock convergence point is set as a selected clock signal. Based on the selected clock signal, a fix point identification operation is performed on the clock tree circuitry structure to obtain a plurality of candidate fix points. A plurality of weighting values of the candidate fix points are calculated, and a plurality of selected fix points are obtained according to the weighting values.

The disclosure further provides a fixing device for a clock tree of a circuit including a memory element and a controller. The memory element stores timing constraint information and a netlist of the circuit. The controller is coupled to the memory element to execute the aforementioned fixing method for the clock tree.

Based on the above description, the fixing method for the clock tree of the disclosure obtains the clock tree circuitry structure through the clock signal path tracking operation, identifies the candidate fix points in the clock tree circuitry structure, sets the weighting values for the candidate fix points, and obtains a plurality of selected fix points according to the weighting values. In this way, the selected fix points may be quickly and automatically generated, and efficiency of design analysis is therefore improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
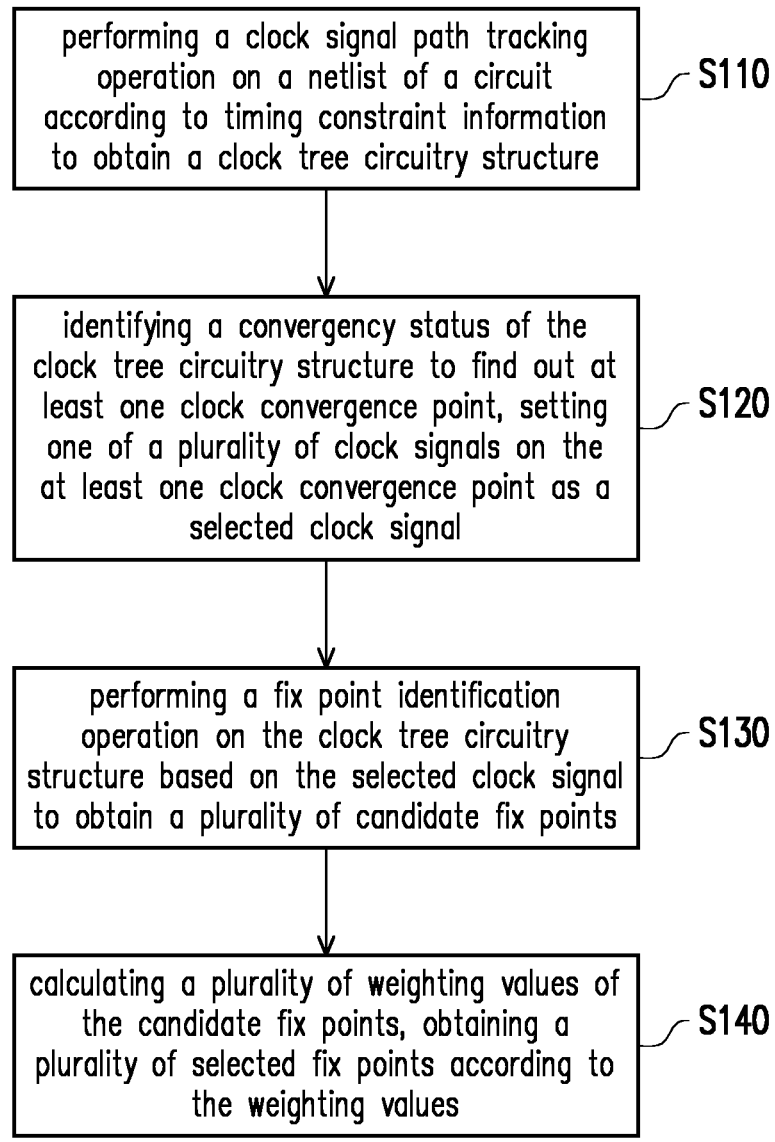
FIG. 1 is a flowchart illustrating a fixing method for a clock tree according to an embodiment of the disclosure.

Referring to FIG. 1, FIG. 1 is a flowchart illustrating a fixing method for a clock tree according to an embodiment of the disclosure. In step S110, a clock signal path tracking operation is performed on a netlist of a circuit according to timing constraint information, so as to obtain a clock tree circuitry structure through the clock signal path tracking operation. Then, in step S120, a convergency status of the clock tree circuitry structure obtained in step S110 is identified to find out at least one clock convergence point, and one of a plurality of clock signals on the at least one clock convergence point is set as a selected clock signal. It should be noted that in a circuit design, there may be a plurality of clock signals in one clock tree circuitry structure. Step S120 is configured to identify the clock convergence point of the clock signals. A designer may select one of the aforementioned multiple clock signals as the selected clock signal.

Incidentally, in this embodiment, the clock convergence point of the clock signals often occurs on circuit elements serving as multiplexers.

In step S130, based on the selected clock signal, a fix point identification operation is performed on the clock tree circuitry structure to obtain a plurality of candidate fix points. Herein, in this embodiment, a plurality of circuit elements associated with the selected clock signal in the clock tree circuitry structure may be analyzed, and these circuit elements (logic gates) are set as a plurality of candidate fix points.

In step S140, a plurality of weighting values of the candidate fix points are set and calculated, and a plurality of selected fix points are obtained according to the weighting values of the candidate fix points. Corresponding to the selected fix points, the designer may modify a logic expression to make logic values of the selected fix points to be sufficient to enable the selected clock signal to be smoothly transmitted in the clock tree circuitry structure, and make a function clock path as a scan clock path.

Figure 2:
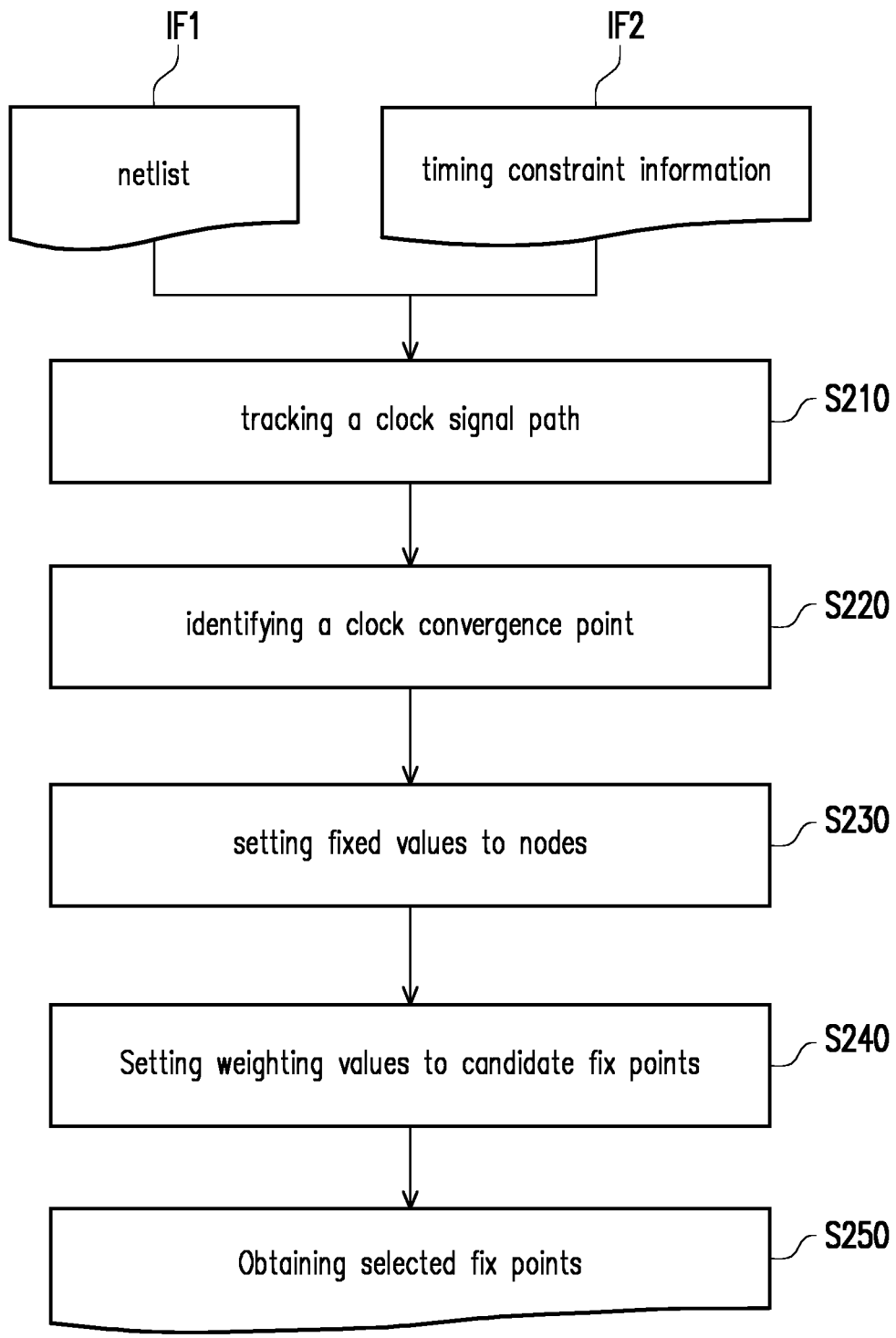
FIG. 2 is a flowchart illustrating a fixing method for a clock tree according to another embodiment of the disclosure.
Figure 3:
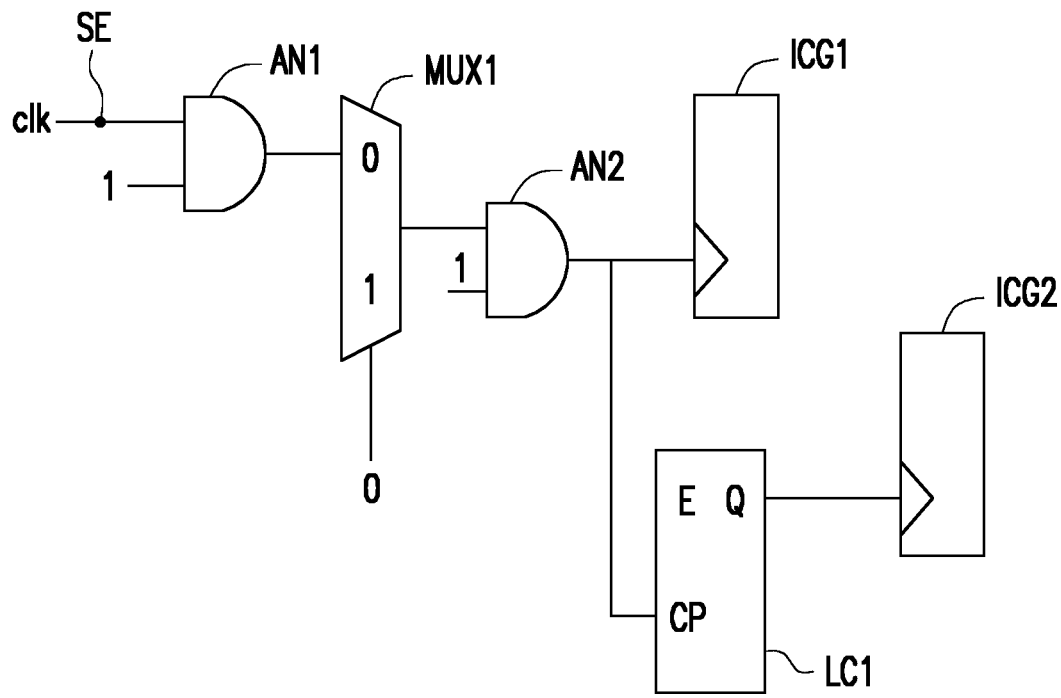
FIG. 3 is a schematic diagram illustrating a clock tree circuitry structure according to an embodiment of the disclosure.

Referring to FIG. 2, FIG. 2 is a flowchart illustrating a fixing method for a clock tree according to another embodiment of the disclosure. In step S210, a netlist IF1 of a circuit and timing constraint information IF2 are received to accordingly perform a clock signal path tracking operation. Referring to FIG. 2 and FIG. 3 together, FIG. 3 is a schematic diagram illustrating a clock tree circuitry structure according to an embodiment of the disclosure. When the clock signal path tracking operation is performed, a clock signal clk in the circuit may be found out, and the tracking operation may be performed according to a transmission direction of the clock signal clk. In the process of tracking, circuit elements on a transmission path of the clock signal clk may be recorded. In FIG. 3, the clock signal clk is received by an AND gate AN1 and is sequentially transmitted to a multiplexer MUX1, an AND gate AN2, and a logic element LC1. It should be noted that the clock signal path tracking operation of the clock signal clk starts from a source SE of the clock signal clk and ends at isolation clock gates (ICG) ICG1 and ICG2 in the path. In this embodiment, the isolation clock gates ICG1 and ICG2 may be D-type flip-flops. In FIG. 3, by recording a connection relationship of the AND gate AN1, the multiplexer MUX1, the AND gate AN2, and the logic element LC1, a clock tree circuitry structure 300 corresponding to the clock signal clk may be established.

It should be noted that in the embodiments of the disclosure, input logic values may be recorded in the circuit elements of the clock tree circuitry structure 300 so that the clock signal clk may be transmitted smoothly. Taking the embodiment of FIG. 3 as an example, one input terminal of the AND gate AN1 receives the clock signal clk, and the other input terminal of the AND gate AN1 must be set to logic value 1, so that the clock signal clk may be transmitted to an output terminal of the AND gate AN1. Similarly, since an input terminal of the multiplexer MUX1 corresponding to a selection signal of logic value 0 is coupled to the output terminal of the AND gate AN1, the input terminal of the multiplexer MUX1 should be set to a logic value. A first input terminal of the AND gate AN2 is coupled to an output terminal of the multiplexer MUX1, so that a second input terminal of the AND gate AN2 should be set to a logic value.

Certainly, the elements and structures included in the clock tree circuitry structure 300 in FIG. 3 are only examples for illustration, and should not be used to limit a scope of the disclosure.

Figure 4:
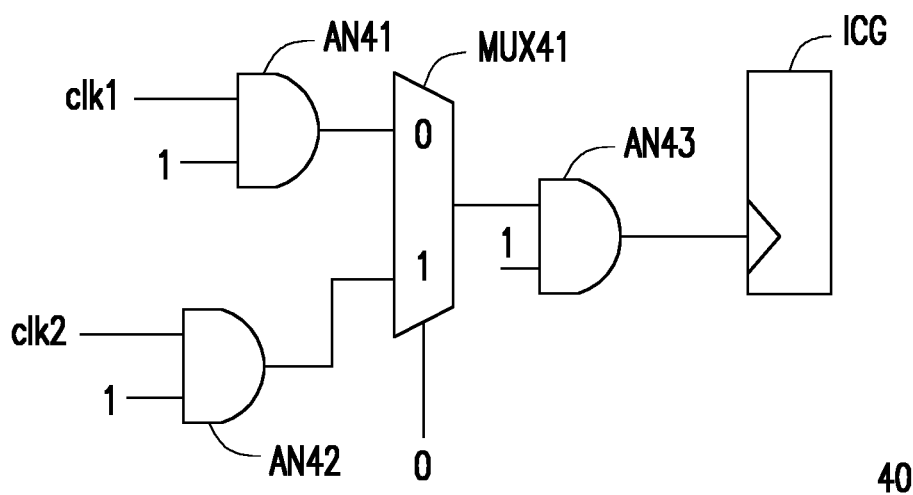
FIG. 4 is a schematic diagram illustrating a clock convergence point according to an embodiment of the disclosure.

Referring to FIG. 2 again, in step S220, a clock convergence point of the clock tree circuitry structure is identified. Referring to FIG. 2 and FIG. 4 together, FIG. 4 is a schematic diagram illustrating a clock convergence point according to an embodiment of the disclosure. In the embodiment of the disclosure, the clock convergence point often occurs on the multiplexer in the clock tree circuitry structure. In FIG. 4, a clock tree circuitry structure 400 has a plurality of clock signals clk1 and clk2. In addition, a multiplexer MUX41 respectively receives the clock signals clk1 and clk2 through the AND gates AN41 and AN42. Here, the multiplexer MUX41 may be identified as a clock convergence point. When the clock convergence point (the multiplexer MUX41) is identified, the designer may select one of the clock signals clk1 and clk2 as a selected clock signal. In the embodiment, the clock signal clk1 is, for example, selected as the selected clock signal, a selection terminal of the multiplexer MUX41 may be set to logic value 0, so that the clock signal clk1 may be transmitted smoothly. In other parts, an input terminal of the AND gate AN41 that does not receive the clock signal clk1 is set to the logic value 1; an input terminal of the AND gate AN42 that does not receive the clock signal clk2 is set to the logic value 1, and an input terminal of the AND gate AN43 that is not coupled to the input terminal of the multiplexer MUX41 may be set to the logic value 1. In addition, an isolation clock gate ICG may be a termination point of the clock tree circuitry structure 400.

Figure 5:
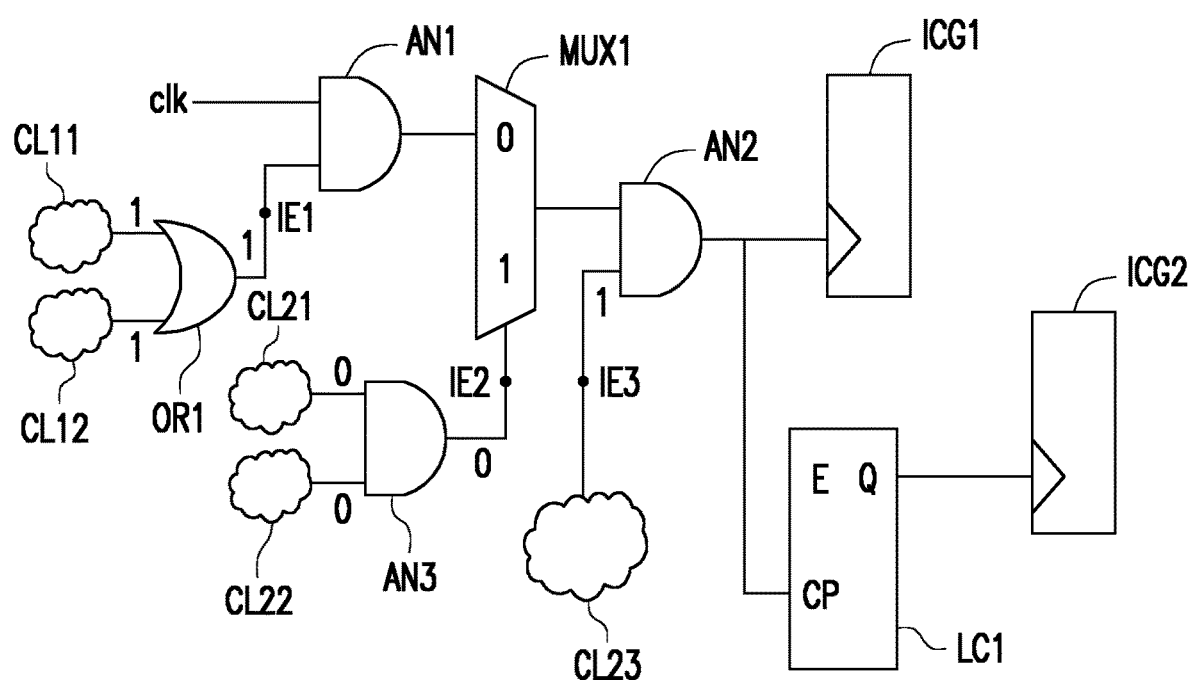
FIG. 5 is a schematic diagram illustrating a clock tree circuitry structure and fix points thereof according to an embodiment of the disclosure.

Referring to FIG. 2 again, after the clock tree circuitry structure and the logic values of all of the input terminals are set, a fix point identification operation of the clock tree circuitry structure may be performed. Referring to FIG. 5, FIG. 5 is a schematic diagram illustrating a clock tree circuitry structure and fix points thereof according to an embodiment of the disclosure. A clock tree circuitry structure 500 is generated based on the clock tree circuitry structure 300 of FIG. 3 and a plurality of control logic circuits around it. The clock tree circuitry structure 500 has a plurality of input terminals IE1 to IE3 used for controlling the clock signal clk1, the input terminals IE1 to IE3 respectively correspond to the AND gate AN1, the multiplexer MUX1, and the AND gate AN2, and the logic values set to the input terminals IE1 to IE3 are respectively logic values 1, 0, and 1.

In addition, the input terminal IE1 is controlled by an OR gate OR1 and combinational logic circuits CL11 and CL12; the input terminal IE2 is controlled by the AND gate AN3 and combinational logic circuits CL21 and CL22; the input terminal IE3 is controlled by a combinational logic circuit CL23. In the embodiment, a plurality of input terminals and output terminals the aforementioned OR gate OR1, the combinational logic circuits CL11, CL12, the AND gate AN3, the combinational logic circuits CL21, CL22, and the combinational logic circuit CL23 may be respectively set as a plurality of candidate fix points.

Next, referring to FIG. 2 again, in step S230, fixed values are set to the nodes, i.e., logic values adapted to effectively transmit the clock signal clk are set on a plurality of circuit elements that are set as the candidate fix points. To be specific, an output terminal of the OR gate OR1 is set to the logic value 1 (equal to the logic value of the input terminal IE1), or at least one of the two input terminals of the OR gate OR1 is set to the logic value 1. An output terminal of the AND gate AN3 is set to the logic value 0 (equal to the logic value of the input terminal IE2), and at least one of the input terminals of the AND gate AN3 needs to be set to the logic value 0. An output terminal of the combinational logic circuit CL3 needs to be set to the logic value 1 (equal to the logic value of the input terminal IE3).

Next, in step S240, a plurality of weighting values are respectively set to the candidate fix points, and in step S250, a plurality of selected fix points are selected from the candidate fix points according to the weighting values.

Figure 6:
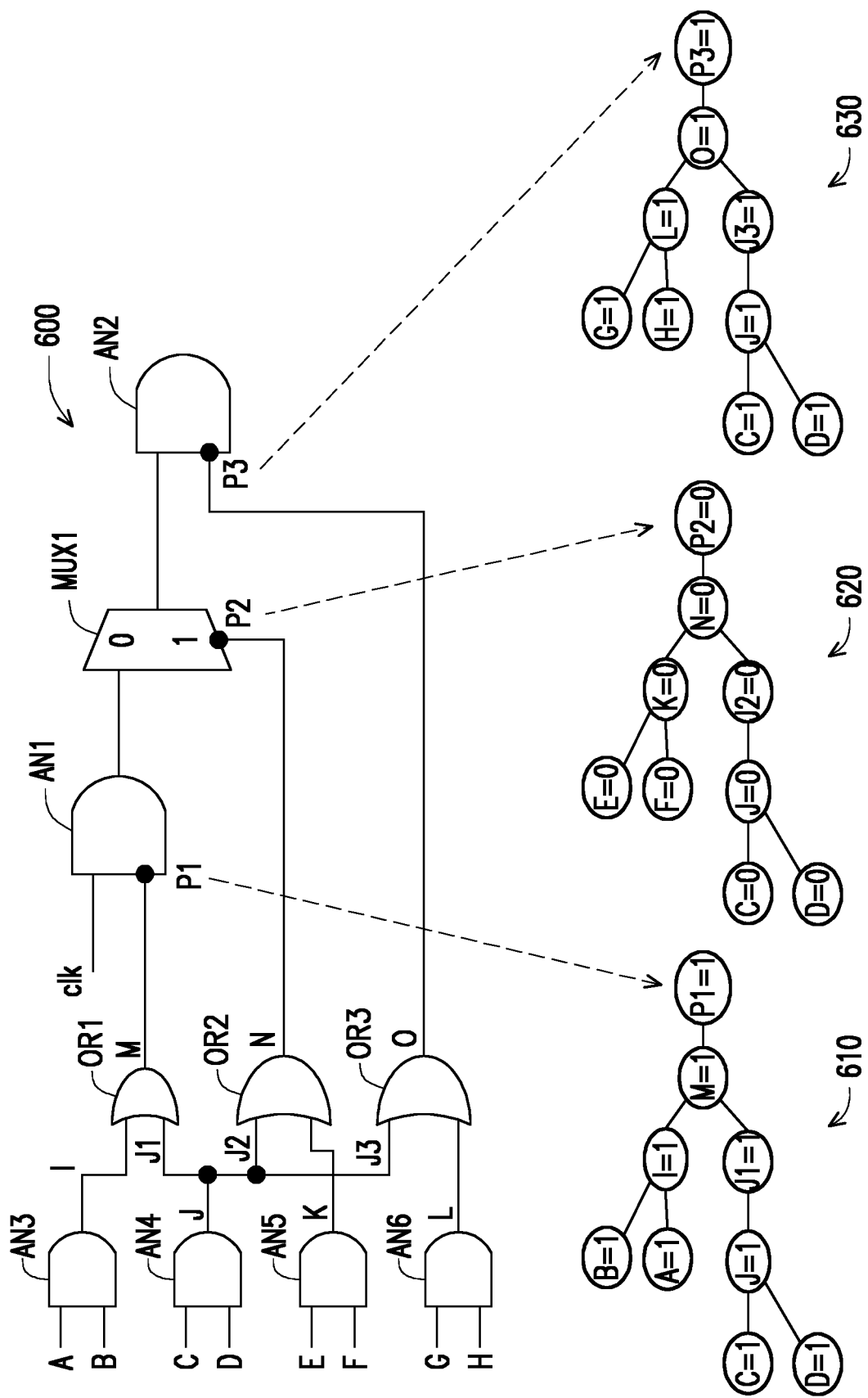
FIG. 6 is a schematic diagram illustrating a method for generating a plurality of candidate fix points according to an embodiment of the disclosure.
Figure 7A:
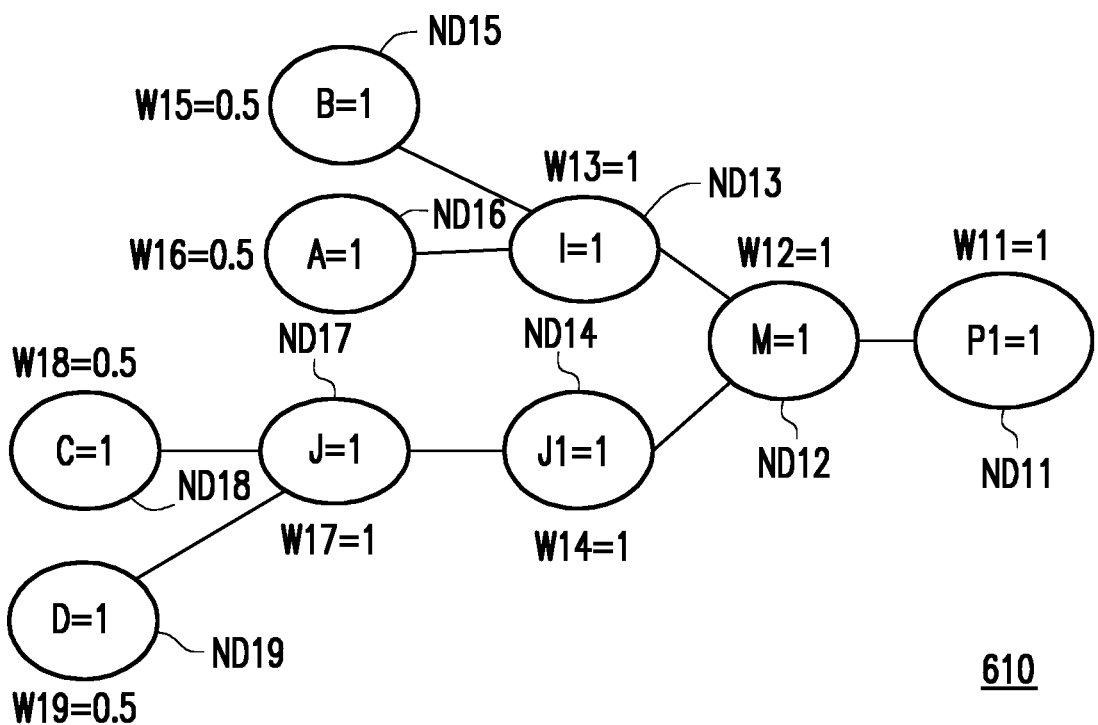
FIG. 7A to FIG. 7C are schematic diagrams illustrating a method for setting weighting values of the candidate fix points.
Figure 7B:
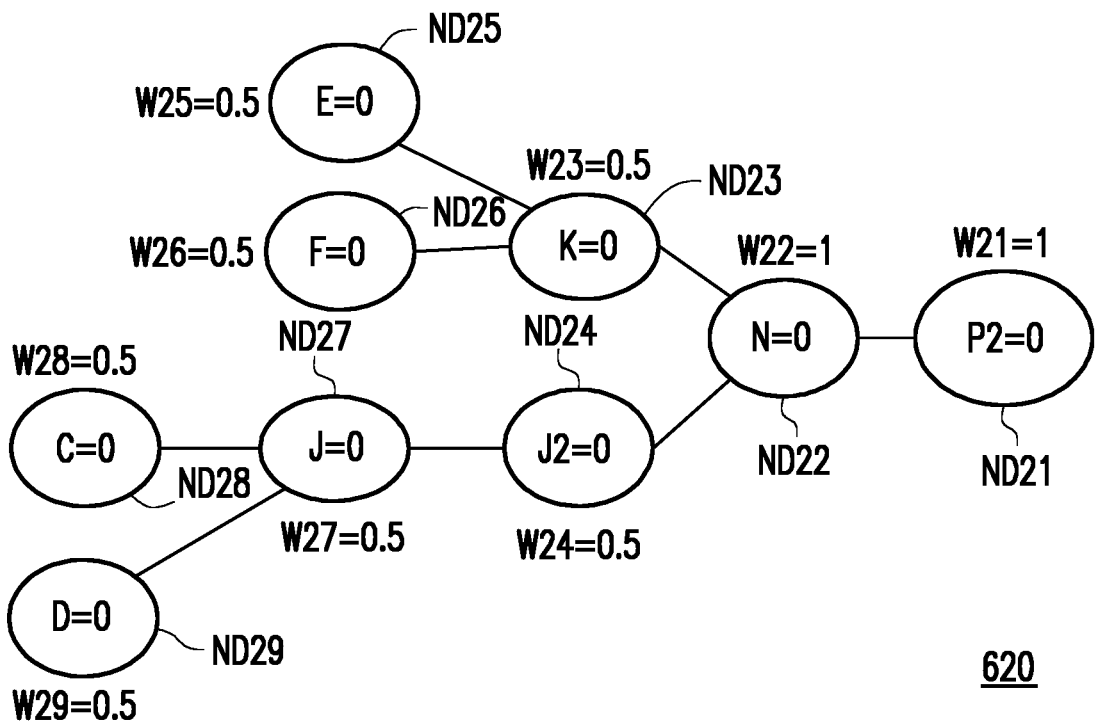
Figures 7C, 8A:
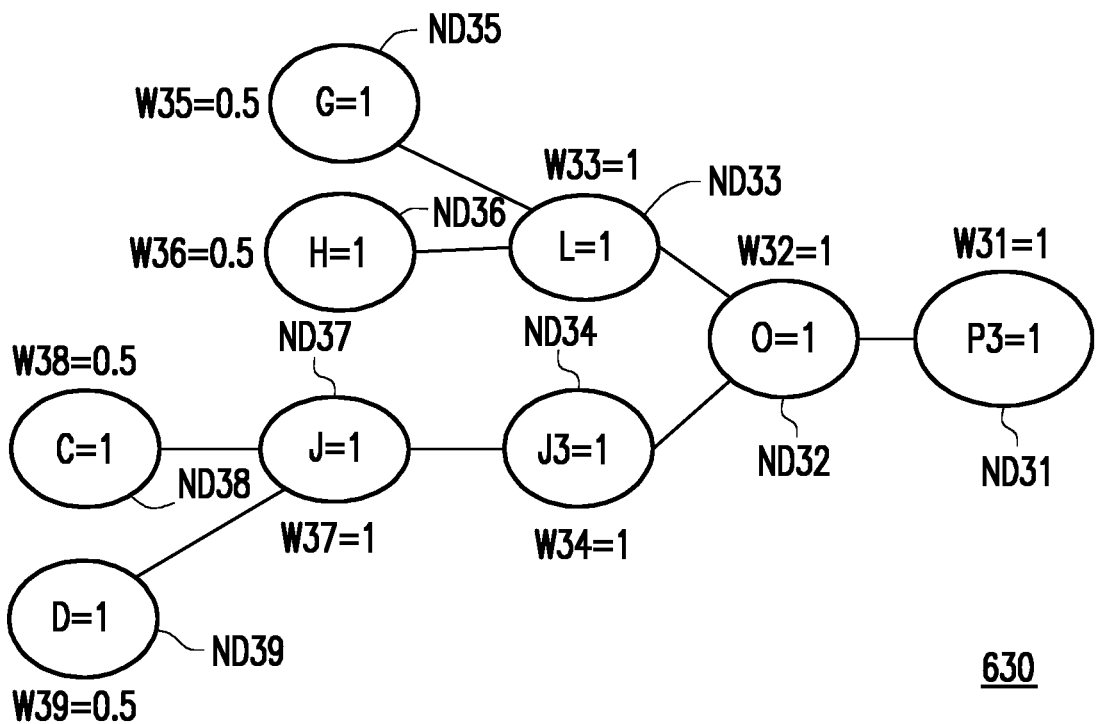
FIG. 8A and FIG. 8B are schematic diagrams illustrating a method for selecting selected fix points.
Figures 8B, 9:
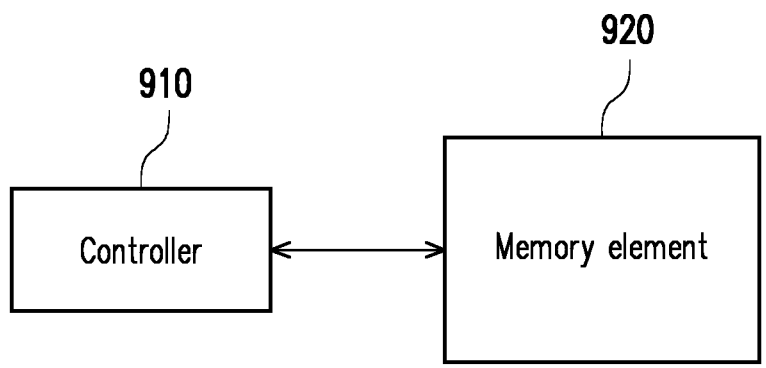
FIG. 9 is a schematic diagram illustrating a clock tree fixing device according to an embodiment of the disclosure.

Regarding implementation details of steps S240 and S250, references may be made by referring to FIG. 6 to FIG. 8B. FIG. 6 is a schematic diagram illustrating a method for generating a plurality of candidate fix points according to an embodiment of the disclosure. FIG. 7A to FIG. 7C are schematic diagrams illustrating a method for setting weighting values of the candidate fix points. FIG. 8A and FIG. 8B are schematic diagrams illustrating a method for selecting the selected fix points.

In FIG. 6, a clock tree circuitry structure 600 corresponds to the clock signal clk and includes AND gates AN1 and AN2 and a multiplexer MUX1. Input terminals P1, P2, and P3 of the AND gate AN1, the multiplexer MUX1 and the AND gate AN2 are respectively set to logic values 1, 0, and 1. Corresponding to the input terminal P1, the OR gate OR1, and AND gates AN3 and AN4 are used as control logic circuits, which may be used to control the logic value of the input terminal P1. As the input terminal P1 is set to the logic value 1, an output terminal M of the OR gate OR1 is set to the logic value 1; input terminals I and J1 (equivalent to an output terminal J of the AND gate AN4) of the OR gate OR1 may be both set to the logic value 1; input terminals A and B of the AND gate AN3 are both set to the logic value 1; and input terminals C and D of the AND gate AN4 are both set to the logic value 1.

In addition, as the input terminal P2 is set to the logic value 0, an output terminal N of the OR gate OR2 is set to the logic value 0; input terminals J2 (equivalent to the output terminal J of the AND gate AN4) and K (equivalent to the output terminal of the AND gate AN5) of the OR gate OR2 may be both set to the logic value 0; input terminals E and F of the AND gate AN5 may be both set to the logic value 0; and the input terminals C and D of the AND gate AN4 are both set to the logic value 0.

As the input terminal P3 is set to the logic value 1, an output terminal 0 of the OR gate OR3 is set to the logic value 1, input terminals J3 (equivalent to the output terminal J of the AND gate AN4) and L (equivalent to an output terminal of the AND gate AN6) of the gate OR3 may be both set to the logic value 1; input terminals G and H of the AND gate AN6 may be both set to the logic value 1; and the input terminals C and D of the AND gate AN4 are both set to the logic value 1.

According to the aforementioned settings of the logic values of each of the terminals, solution meaning tree structures 610, 620, and 630 may be respectively established corresponding to the input terminals P1, P2, and P3. The solution meaning tree structures 610, 620, and 630 include tree structures formed by a plurality of candidate fix points respectively corresponding to the input terminals P1, P2, and P3.

It should be noted that in the embodiments of the disclosure, binary integer linear programming or a heuristic algorithm may be applied to obtain the selected fix points from the solution meaning tree structures 610, 620, and 630. An implementation example is presented below to describe the method of obtaining the selected fix points.

In FIG. 7A, regarding the solution meaning tree structure 610, a plurality of terminals and corresponding set logic values therein may be analyzed, and a weighting value is applied to each candidate fix point in the solution meaning tree structure 610. In a weighting value setting method, one candidate fix point in the solution meaning tree structure 610 may be selected as a parent node, and weighting values of a plurality of child nodes of the parent node are set according to a logic circuit type corresponding to the parent node and a weighting value of the parent node. First, a candidate fix point ND11 may be set as a parent node, and a weighting value W11 of the candidate fix point ND11 may be set as W11=1. Since the candidate fix point ND11 has only one child node (a candidate fix point ND12), a weighting value W12 of the candidate fix point ND12 is the same (=1) as the weighting value W11 of the candidate fix point ND11. Then, since the candidate fix point ND12 corresponds to the output terminal M of the OR gate OR1, when the candidate fix point ND12 is a parent node, weighting values W13 and W14 of child nodes (candidate fix points ND13, ND14) thereof may be the same as the weighting value W12 of the candidate fix point ND12. In addition, when the candidate fix point ND13 is a parent node, as the candidate fix point ND13 corresponds to the output terminal I of the AND gate AN3, the weighting value W13 of the candidate fix point ND13 may be evenly distributed to its child nodes (candidate fix points ND15, ND16), and weighting values W15, W16 of the candidate fix points ND15 and ND16 are both equal to 0.5.

Deduced by analogy according to the above method, the weighting values W11 to W19 of all of the candidate fix points ND11 to ND19 may be calculated.

Moreover, in FIG. 7B, according to the same manner as that in FIG. 7A, weighting values W21 to W29 may be respectively set for candidate fix points ND21 to ND29 in the solution meaning tree structure 620. Similarly, in FIG. 7C, weighting values W31 to W39 may also be effectively set for candidate fix points ND31 to ND39 in the solution meaning tree structure 630.

Next, in the embodiments of the disclosure, the weighting values W11 to W39 respectively corresponding to all of the candidate fix points ND11 to ND39 may be sorted, and the weighting values of the candidate fix points corresponding to the same terminal and set with the same logic value may be added to obtain FIG. 8A. It should be noted that the candidate fix point ND17 in FIG. 7A and the candidate fix point ND37 in FIG. 7C correspond to the same output terminal J and are set with the same logic value 1. Therefore, the weighting values W17 and W37 of the candidate fix point ND17 and the candidate fix point ND37 may be added to generate a weighting value (=2) corresponding to J=1.

It may be learned from FIG. 8A that the candidate fix point corresponding to J=1 has the highest weighting value, so that the candidate fix point of J=1 may be selected as a first selected fix point.

Next, in FIG. 8B, as the candidate fix point of J=1 has been selected, all of the candidate fix points related to the solution meaning tree structures 610 and 630 are deleted. At this time, the candidate fix point corresponding to N=0 has the highest weighting value (=1), so that the candidate fix point corresponding to N=0 is selected as a second selected fix point.

Further, through the fixing method for the clock tree of the embodiment of the disclosure, it may be known that only the output of the output terminal J of the AND gate AN4 in the clock tree circuitry structure 600 of FIG. 6 needs to be controlled to the logic value 1, the input terminals P1 and P3 may be controlled to the logic value 1, and by controlling the output terminal N of the OR gate OR2 in the clock tree circuit structure 600 of FIG. 6 to generate the logic value 0, the input terminal P2 may be controlled to the logic value 0. In this way, the clock signal clk may be effectively transmitted. The embodiment of the disclosure may automatically and quickly implement the prefix operation of the clock tree.

Referring to FIG. 9, FIG. 9 is a schematic diagram illustrating a clock tree fixing device according to an embodiment of the disclosure. A clock tree fixing device 900 includes a controller 910 and a memory element 920. The controller 910 and the memory element 920 are coupled to each other. The memory element 920 may be used to store the timing constraint information and the netlist of the circuit. The controller 910 may read the timing constraint information and the netlist of the circuit from the memory element 920, and execute the fixing method of the clock tree as that shown in FIGS. 1 and 2 according to the timing constraint information and the netlist of the circuit.

The implementation details of the fixing method of the clock tree have been described in detail in the aforementioned embodiment, so that details thereof are not repeated.

In this embodiment, the memory element 920 may be used to store temporary data generated by the controller 910 during calculation processes. In terms of hardware framework, the controller 910 may be a processor with computing capability. Alternatively, the controller 910 may be designed through a hardware description language (HDL) or any other digital circuit design method well known to those with ordinary knowledge in the art, and is a hardware circuit implemented through a field programmable logic gate array (FPGA), a complex programmable logic device (CPLD) or an application-specific integrated circuit (ASIC). In addition, the memory element 920 may be various types of random access memory (RAM), read-only memory (ROM), etc., but the disclosure is not limited thereto.

In view of the foregoing, in the disclosure, the plurality of candidate fix points in the clock tree circuitry structure are identified, the plurality of weighting values are set for the candidate fix points, and then the selected fix points are found out according to the weighting values. In this way, the prefix operation of the clock tree of the circuit may be quickly and automatically executed, and the efficiency of circuit design is therefore improved.

What is claimed is:

1. A fixing method for a clock tree, comprising:
   performing a clock signal path tracking operation on a netlist of a circuit according to timing constraint information to obtain a clock tree circuitry structure;
   identifying a convergency status of the clock tree circuitry structure to find out at least one clock convergence point, setting one of a plurality of clock signals on the at least one clock convergence point as a selected clock signal;
   performing a fix point identification operation on the clock tree circuitry structure based on the selected clock signal to obtain a plurality of candidate fix points; and
   calculating a plurality of weighting values of the candidate fix points, obtaining a plurality of selected fix points according to the weighting values.

2. The fixing method for the clock tree according to claim 1, wherein the step of calculating the weighting values of the candidate fix points and obtaining the selected fix points according to the weighting values further comprises:
   establishing a plurality of solution meaning tree structures for the candidate fix points; and
   performing binary integer linear programming or a heuristic algorithm on the solution meaning tree structures to obtain the selected fix points.

3. The fixing method for the clock tree according to claim 2, wherein the step of calculating the weighting values of the candidate fix points further comprises:
   setting each of the candidate fix points as a parent node, and setting weighting values of a plurality of child nodes of the parent node according to a logic circuit type corresponding to the parent node and a weighting value of the parent node.

4. The fixing method for the clock tree according to claim 3, wherein, a sum of the weighting values of the child nodes is equal to the weighting value of the parent node when a logic circuit corresponding to the parent node is an AND gate, and the weighting value of each of the child nodes is equal to the weighting value of the parent node when the logic circuit corresponding to the parent node is an OR gate or a buffer.

5. The fixing method for the clock tree according to claim 1, wherein the step of obtaining the selected fix points according to the weighting values further comprises:
   selecting the largest one of the weighting values to generate a selected weighting value, setting the candidate fix point corresponding to the selected weighting value as a first selected node; and
   removing at least one association candidate fix point associated with the first selected node, selecting one of a plurality of remaining candidate fix points with the largest weighting value as a second selected node.

6. The fixing method for the clock tree according to claim 1, wherein the step of performing the clock signal path tracking operation on the netlist of the circuit according to the timing constraint information to obtain the clock tree circuitry structure further comprises:
   finding out a plurality of circuit elements on a transmission path of the clock signal based on a clock signal; and
   marking a plurality of logic signals that enable the clock signal to be transmitted smoothly on the circuit elements.

7. The fixing method for the clock tree according to claim 1, wherein after the step of setting one of the clock signals on the at least one clock convergence point as the selected clock signal, the fixing method for the clock tree further comprises:
   marking a logic signal that enables the selected clock signal to be transmitted on the at least one clock convergence point.

8. A fixing device for a clock tree of a circuit, comprising:
   a memory element, storing timing constraint information and a netlist of the circuit; and
   a controller, coupled to the memory element, and configured to:
   perform a clock signal path tracking operation on the netlist according to timing constraint information to obtain a clock tree circuitry structure;
   identify a convergency status of the clock tree circuitry structure to find out at least one clock convergence point, set one of a plurality of clock signals on the at least one clock convergence point as a selected clock signal;
   perform a fix point identification operation on the clock tree circuitry structure to obtain a plurality of candidate fix points based on the selected clock signal; and
   calculate a plurality of weighting values of the candidate fix points, obtain a plurality of selected fix points according to the weighting values.

9. The fixing device for the clock tree according to claim 8, wherein the controller establishes a plurality of solution meaning tree structures for the candidate fix points and performs binary integer linear programming or a heuristic algorithm on the solution meaning tree structures to obtain the selected fix points.

10. The fixing device for the clock tree according to claim 8, wherein the controller is configured to:
    set each of the candidate fix points as a parent node, set weighting values of a plurality of child nodes of the parent node according to a logic circuit type corresponding to the parent node and a weighting value of the parent node;

select the largest one of the weighting values to generate a selected weighting value, set the candidate fix point corresponding to the selected weighting value as a first selected node; and remove at least one association candidate fix point associated with the first selected node, select one of a plurality of remaining candidate fix points with the largest weighting value as a second selected node.

* * * * *